(12) United States Patent
Chen et al.

(10) Patent No.: US 9,099,173 B2
(45) Date of Patent: Aug. 4, 2015

(54) CLASSIFYING FLASH DEVICES USING ECC

(71) Applicants: Jian Chen, Irvine, CA (US); Phan F. Hoang, Rancho Santa Margarita, CA (US)

(72) Inventors: Jian Chen, Irvine, CA (US); Phan F. Hoang, Rancho Santa Margarita, CA (US)

(73) Assignee: VIRTIUM TECHNOLOGY, INC., Rancho Santa Margarita, CA (US)

( * ) Notice: Subject to any disclaimer, the term of this patent is extended or adjusted under 35 U.S.C. 154(b) by 73 days.

(21) Appl. No.: 13/715,807

(22) Filed: Dec. 14, 2012

(65) Prior Publication Data

US 2014/0173369 A1    Jun. 19, 2014

(51) Int. Cl.

| | | |
|---|---|---|
| G11C 7/24 | (2006.01) | |
| G11C 16/34 | (2006.01) | |
| G11C 29/08 | (2006.01) | |
| G11C 29/42 | (2006.01) | |
| G06F 11/10 | (2006.01) | |
| G11C 29/04 | (2006.01) | |
| G11C 29/44 | (2006.01) | |

(52) U.S. Cl.
CPC ............. *G11C 7/24* (2013.01); *G06F 11/1048* (2013.01); *G11C 16/349* (2013.01); *G11C 29/08* (2013.01); *G11C 29/42* (2013.01); *G11C 2029/0411* (2013.01); *G11C 2029/4402* (2013.01)

(58) Field of Classification Search
CPC ....... G06F 3/038; G06F 3/0383; G11C 29/10; G11C 29/40; G11C 7/1051; G11C 7/1069
USPC .......................................... 714/718; 365/201
See application file for complete search history.

(56) References Cited

U.S. PATENT DOCUMENTS

| | | | | |
|---|---|---|---|---|
| 5,841,893 | A * | 11/1998 | Ishikawa et al. ............... 382/145 |
| 6,384,593 | B1 * | 5/2002 | Kobayashi et al. ....... 324/750.05 |
| 6,970,815 | B1 * | 11/2005 | Bombal et al. ................... 703/15 |
| 7,032,143 | B1 * | 4/2006 | Waller ............................ 714/718 |
| 2002/0036161 | A1 * | 3/2002 | Nemoto et al. ................ 209/573 |
| 2002/0053045 | A1 * | 5/2002 | Gillenwater et al. ............ 714/38 |
| 2008/0049514 | A1 * | 2/2008 | Mondello et al. ......... 365/185.22 |
| 2008/0126556 | A1 * | 5/2008 | Perng et al. .................... 709/231 |
| 2011/0167306 | A1 * | 7/2011 | Kimura ........................ 714/718 |
| 2011/0231153 | A1 * | 9/2011 | Hamilton et al. .............. 702/180 |

* cited by examiner

*Primary Examiner* — Guy Lamarre

(57) ABSTRACT

An embodiment is a technique to classify a flash device. Test data to a flash device are accessed in unscramble and scramble modes under a test mode. Error correcting code (ECC) results are recorded on the test data for the unscramble and scramble modes. A device quality figure is calculated based on the ECC results for the unscramble and scramble modes. The flash device is classified using the device quality figure.

20 Claims, 6 Drawing Sheets

US 9,099,173 B2

CLASSIFYING FLASH DEVICES USING ECC

TECHNICAL FIELD

The presently disclosed embodiments are directed to the field of flash devices, and more specifically, to testing flash devices.

BACKGROUND

Flash memory devices (e.g., NAND flash devices) have become increasingly popular in data storage for computer systems, mobile devices, and consumer devices (e.g., cameras). Solid-state drives (SSDs) using flash devices have now become important in many data storage applications. The life expectancy and data quality of flash devices depend on several factors such as data write rate, program and erase cycles, and environmental conditions (e.g., temperature). Applications using flash devices may have various requirements. For data intensive applications such as real-time databases with frequent updates, it is important to have long-life flash devices. In contrast, applications that have short commercial time span and infrequent data updates such as mobile phones may not need long-life flash devices. Accordingly, there exists a need to classify flash devices according to their quality and reliability so that they may be properly used in a variety of applications.

Current techniques for classifying flash devices have a number of drawbacks. Manufacturers of flash devices do not provide grades for their flash devices. While they do provide test information on their flash devices (e.g., initial valid blocks when first shipped, Total Bytes Written or Tera Bytes Written), this information may not be useful because it does not provide an accurate picture of the quality of the devices. In addition, most flash devices have comparable number of invalid blocks or Total Bytes Written or Tera Bytes Written (TBW) and therefore it is difficult to distinguish them. Furthermore, each manufacturer may have its own test parameters and therefore classifying flash devices that are manufactured by different manufacturers may not be accurate.

SUMMARY

One disclosed feature of the embodiments is a technique to classify a flash device. Test data to a flash device are accessed in unscramble and scramble modes under a test mode. Error correcting code (ECC) results are recorded on the test data for the unscramble and scramble modes. A device quality figure is calculated based on the ECC results for the unscramble and scramble modes. The flash device is classified using the device quality figure.

BRIEF DESCRIPTION OF THE DRAWINGS

Embodiments may best be understood by referring to the following description and accompanying drawings that are used to illustrate embodiments. In the drawings.

DETAILED DESCRIPTION

Figure 1:
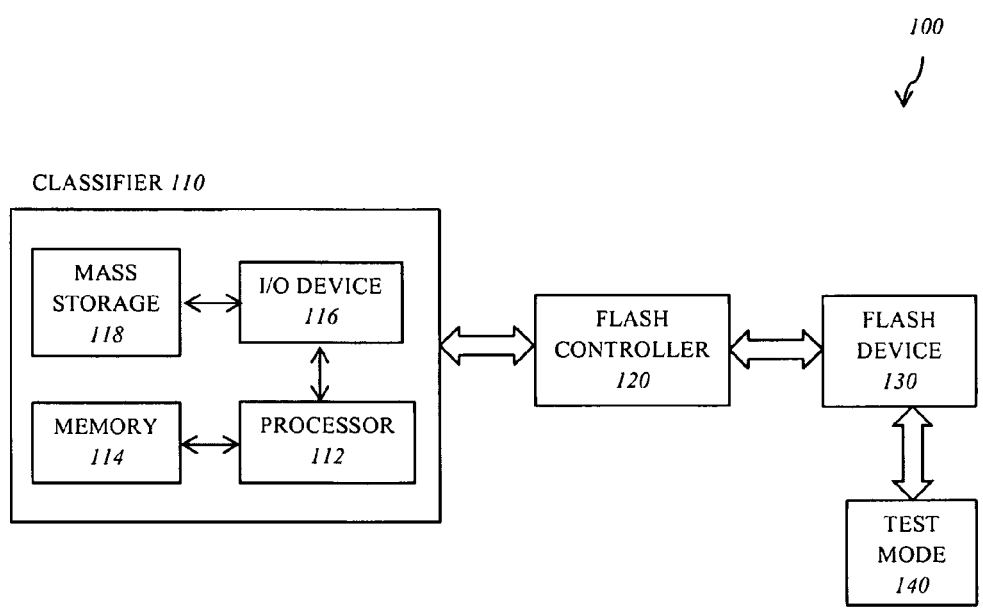
FIG. 1 is a diagram illustrating a system according to one embodiment.

One disclosed feature of the embodiments is a technique to classify a flash device. Test data to a flash device are accessed in unscramble and scramble modes under a test mode. Error correcting code (ECC) results are recorded on the test data for the unscramble and scramble modes. A device quality figure is calculated based on the ECC results for the unscramble and scramble modes. The flash device is classified using the device quality figure.

In the following description, numerous specific details are set forth. However, it is understood that embodiments may be practiced without these specific details. In other instances, well-known circuits, structures, and techniques have not been shown to avoid obscuring the understanding of this description.

One disclosed feature of the embodiments may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc. One embodiment may be described by a schematic drawing depicting a physical structure. It is understood that the schematic drawing illustrates the basic concept and may not be scaled or depict the structure in exact proportions.

One of the particular characteristics of a flash memory device is its sensitivity to the pattern of data written to the device. This sensitivity may be caused by the device structure and it may represent the device quality. This quality may reflect the data retention ability, the device robustness under harsh environmental conditions, error rate, lifespan, etc. Because of this, data may be scrambled or organized before being written into the flash to reduce the pattern-dependent sensitivities, disturbance effects, or other types of errors. When the data are read back, they are descrambled or re-organized to return to their original value. The scrambling and descrambling of data may be performed on the fly by a special-purpose circuit or processor. Typically, this functionality is included in a flash controller. Since the sensitivity to data pattern may reflect the device quality, it is observed that the quality of the device may be characterized by comparing its performance with unscrambled data and scrambled data. One of the performance criteria may be the ability to reduce errors using scrambled data. This may be quantified by the number of error corrections on the data. Accordingly, the improvement or dissimilarity in error correction for scrambled data in comparison with unscrambled data may reflect the device quality. This improvement may be quantified by a number of ways. One simple way is to determine the numbers of bits that are corrected during ECC for scrambled and unscrambled data. The dissimilarity measure between the scramble and unscramble modes may then be computed. This dissimilarity measure may be combined with other testing conditions such as temperature, number of erase cycles, etc. to arrive at a device quality figure which may be used to classify the device.

The device quality figure may be a scalar or a vector. This device quality figure is used to separate a batch of flash devices into classes having different qualities. This process may be referred to as binning where flash devices are separated into bins according to their classes or grades. The classification or binning may be performed using suitable classification algorithms. In one embodiment, the classification is performed using thresholding where one or more threshold values are used. In another embodiment, clustering may be performed on the flash devices. The number of classes may depend on the characteristics of the device quality figures of the flash devices. For simple binning, two classes or grades may be sufficient. For more detailed binning, more than two classes may be used. When cluster analysis is used to perform classification, the number of classes may depend on the number of clusters that are well separated.

FIG. 1 is a diagram illustrating a system 100 according to one embodiment. The system 100 includes a classifier 110, a flash controller 120, a flash device 130, and a test mode 140. The system 100 may include more or less than the above components. For example, the classifier 110 may be integrated with the flash controller 120. In addition, any of these components may be implemented in hardware, software, firmware, or any combination of hardware, software, and firmware.

The classifier 110 classifies the flash device 130 into one of two or more classes or grades. The class or grade of a flash device represents the quality of the device according to some performance criteria. The classifier includes a processor 112, a memory 114, and input/output (110) device 116, and a mass storage 118. The classifier 110 may include more or less than the above components.

The processor 112 may be any programmable device that may execute instructions. It may be a general-purpose microprocessor, an embedded controller, a digital signal processor, or an applications specific integrated circuit (ASIC), etc. The memory stores instructions that, when executed by the processor 112, cause the processor 112 to perform operations as described in the following. The I/O device 116 may include input devices (e.g., keyboard, mouse) and output devices (e.g., display, printer), or any other I/O devices such as graphics device, network controller, communication interface, etc. The mass storage 118 may include any mass storage device such as hard disk (HD), solid-state drive (SSD), compact disk Read Only Memory (CD-ROM) that store programs or data.

The flash controller 120 may be any flash controller or SSD controller that controls the flash device 130 and has standard control features or functionalities including error correcting code (ECC) and data scrambling and de-scrambling. The data scrambling feature may be enabled or disabled. When this feature is enabled, the data may be scrambled before writing to the flash device 130. When this feature is disabled, the data are not scrambled. The order of the ECC and the scrambling may be alternated. The flash controller 120 may have flash interface that may connect to multiple flash devices. It may support Self-Monitoring, Analysis, and Reporting Technology (SMART) ATA commands.

The flash device 130 may be any semiconductor flash memory device such as a NAND flash memory, a NOR flash memory. It may be a single die or a multiple die device. It may be Single Level Cell (SLC) or Multi Level Cell (MLC). It may be organized in any configurations, such as 512 Mb to 128 Gb density, block size from 16K to 512K, page size from 512 to 8K, etc.

The test mode or test condition 140 is a mode or condition under which the flash device 130 is tested. It may include at least one of a temperature condition and a program/erase (P/E) cycle condition. Additional test parameters may be used. The temperature condition may be one of a low temperature (e.g., −30° C.), average temperature (e.g., room temperature), and a high temperature (e.g., 85° C.). The P/E cycle condition is the number of programs/erasures and may be one of a low P/E cycle (e.g., less than 50), an average P/E cycle (e.g., greater than 50 and less than 300), and a high P/E cycle (e.g., greater than 300). As is known by one skilled in the art, more or less than these numbers of temperature or P/E cycle may be used.

Figure 2:
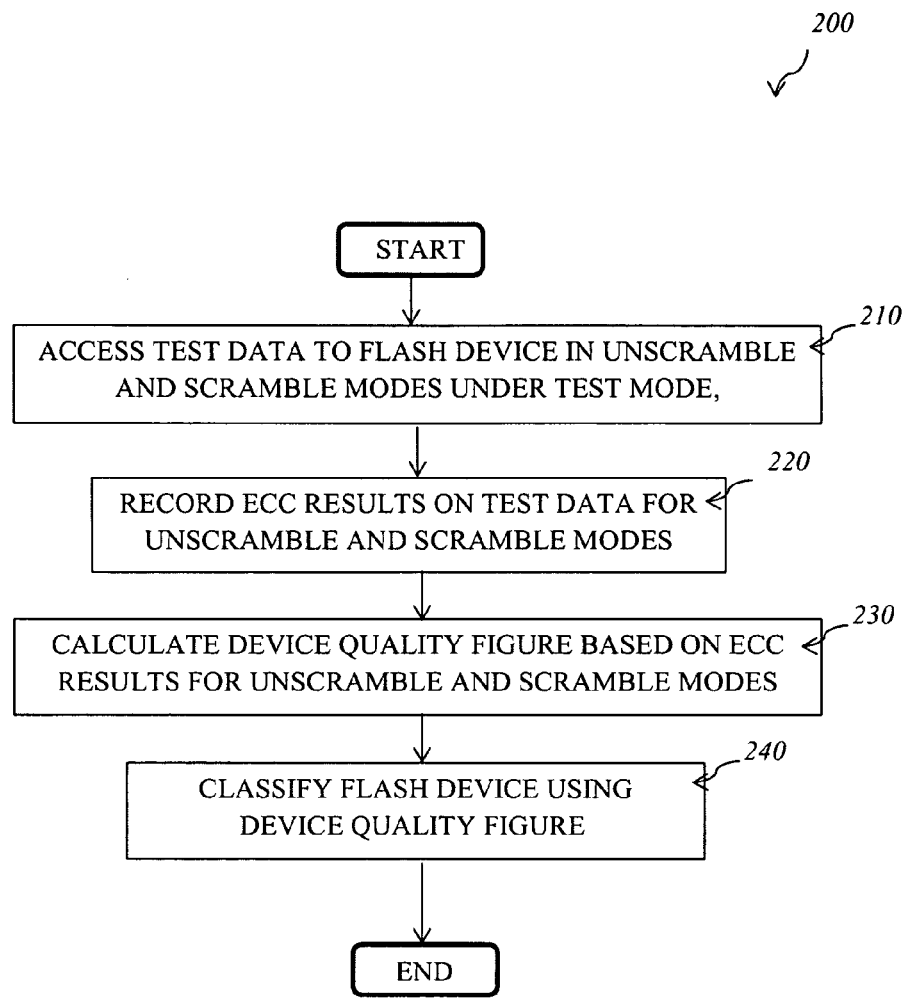
FIG. 2 is a flowchart illustrating a process to classify a flash device according to one embodiment.

FIG. 2 is a flowchart illustrating a process 200 to classify a flash device according to one embodiment.

Upon START, the process 200 accesses test data to a flash device in unscramble and scramble modes under a test mode or test condition (Block 210). The unscramble mode and scramble mode may be referred to as the data state. The flash device may be any semiconductor flash memory device. In one embodiment, it is a NAND flash device. The test mode or test condition includes at least one of a temperature condition and a program/erase (P/E) cycle condition. The temperature condition is one of a low temperature, an average temperature (e.g., ambient temperature) and a high temperature. The P/E cycle condition is one of a low P/E cycle, an average P/E cycle, and a high P/E cycle.

Next, the process 200 records error correcting code (ECC) results on the test data for the unscramble and scramble modes (Block 220). The ECC results include the number of bits in the test data that need to be corrected during ECC operation on the data. Then, the process 200 calculates a device quality figure based on the ECC results for the unscramble and scramble modes (Block 230). The device quality figure represents the quality of the flash device. Next, the process 200 classifies the flash device using the device quality figure (Block 240). The process 200 is then terminated.

Figure 3:
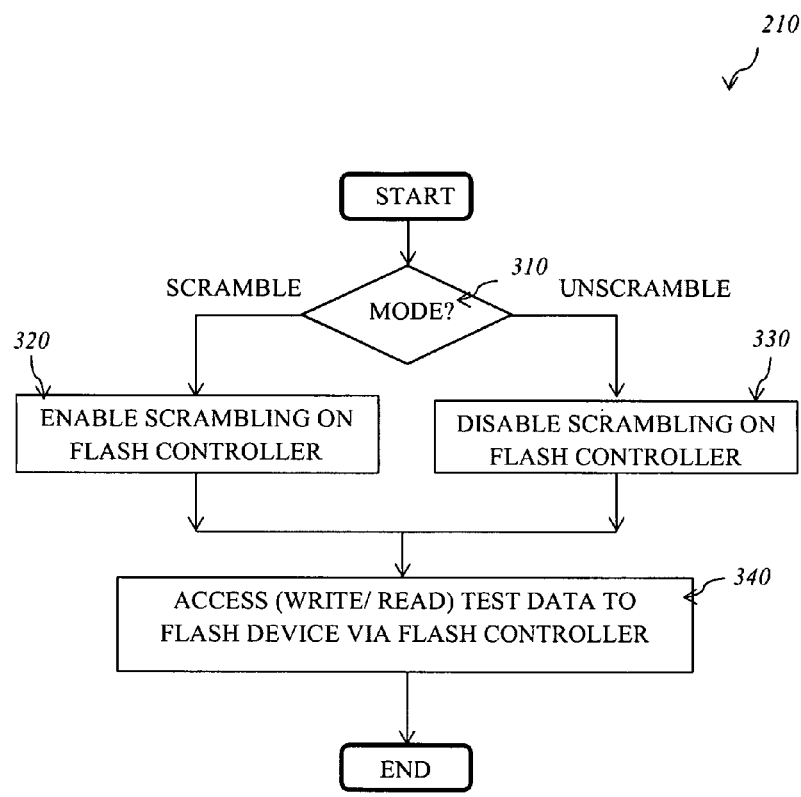
FIG. 3 is a flowchart illustrating a process to access test data according to one embodiment.

FIG. 3 is a flowchart illustrating the process 210 shown in FIG. 2 to access test data according to one embodiment.

Upon START, the process 210 determines if the access mode is the scramble mode where the test data are scrambled or the unscramble mode where the test data are not scrambled (Block 310). If the mode is the scramble mode, the process 210 enables scrambling on a flash controller for the scramble mode (Block 320). If the mode is the unscramble mode, the process 210 disables scrambling on the flash controller for the unscramble mode (Block 330). The flash controller has a scrambler and descrambler, an ECC processor, other control functions, and interface to the flash device.

Next, the process 210 accesses the test data to the flash device via a flash controller (Block 340) and is then terminated. Accessing includes writing the test data to the flash device via a flash controller and reading the test data from the flash device via the flash controller. The data access may be performed several times to provide statistically meaningful results.

Figure 4:
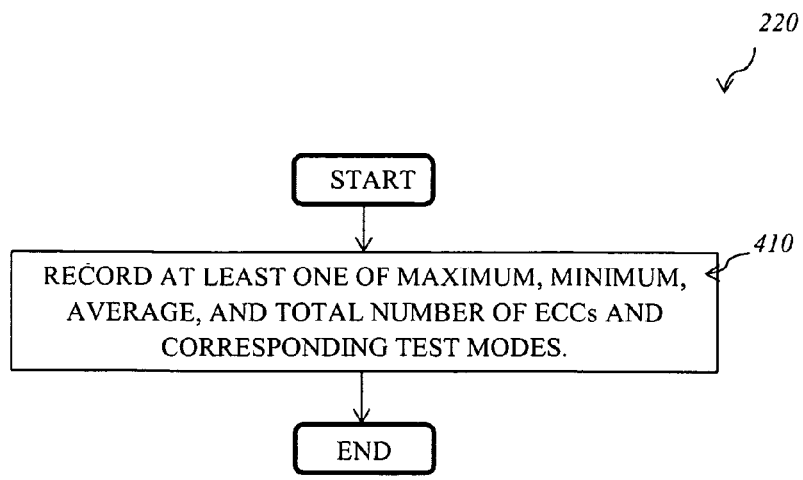
FIG. 4 is a flowchart illustrating a process to record ECC results according to one embodiment.

FIG. 4 is a flowchart illustrating the process 220 shown in FIG. 2 to record ECC results according to one embodiment.

Upon START, the process 220 records at least one of a maximum number of ECCs, a minimum number of ECCs, an average number of ECCs, and a total number of ECCs and the corresponding test modes (Block 410) and is then terminated.

Let x, y, z, and w be the maximum number of ECCs, a minimum number of ECCs, an average number of ECCs, and a total number of ECCs, respectively. These parameters may be indexed by the test modes and then are used to determine a dissimilarity measure between the data states (i.e., the scramble and unscramble mode). Suppose there are two test modes or test conditions: temperature and P/E cycle. One skilled in the art will realize that more than two test modes or conditions may be used. Let i, j, k be the indices that indicate the temperature, the P/E cycle, and the data state. The indexed parameters may be written as $x_{ij}^k$, $y_{ij}^k$, $z_{ij}^k$, and $w_{ij}^k$. For example, i=1 is low temperature, i=2 is average temperature, and i=3 is high temperature; j=1 is low P/E, j=2 is average P/E, and j=3 is high P/E; and k=0 for unscrambled data and k=1 for scrambled data. The total number of parameters is thus 72. Thus, $x_{11}^0$ corresponds the maximum number of ECCs at low temperature, low P/E and unscrambled data, $x_{12}^1$ corresponds to the maximum number of ECCs at low temperature, average P/E, and scrambled data, etc. The following is the list of additional examples of these indexed parameters:

$x_{11}^0$=max ECC, low temperature, low P/E, unscrambled data.

$x_{22}^0$=max ECC, average temperature, average P/E, unscrambled data.

$x_{13}^0$=max ECC, low temperature, high P/E, unscrambled data.

$y_{21}^0$=min ECC, average temperature, low P/E, unscrambled data.

$z_{31}^0$=avg ECC, high temperature, low P/E, unscrambled data.

$w_{11}^0$=total ECC, low temperature, low P/E, unscrambled data.

$w_{23}^0$=total ECC, average temperature, high P/E, unscrambled data.

$x_{11}^1$=max ECC, low temperature, low P/E, scrambled data.

$y_{23}^1$=min ECC, average temperature, high P/E, scrambled data.

$z_{12}^1$=avg ECC, low temperature, average P/E, scrambled data.

$z_{13}^1$=avg ECC, low temperature, high P/E, scrambled data.

Figure 5:
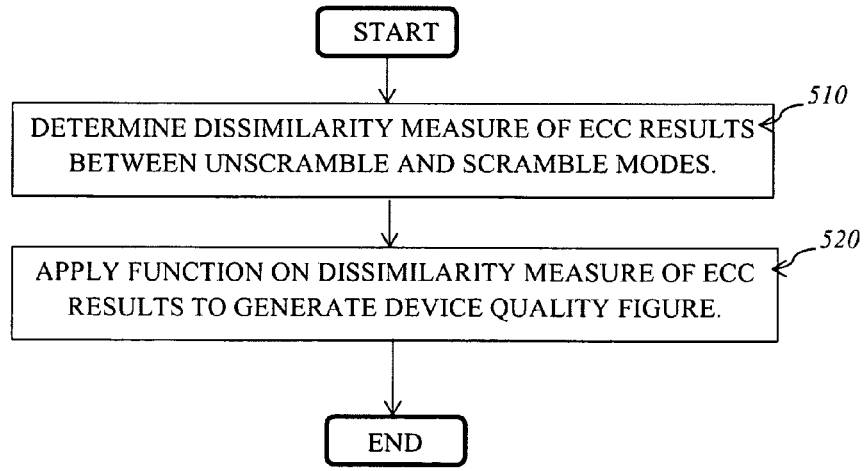
FIG. 5 is a flowchart illustrating a process to calculate device quality figure according to one embodiment.

$w_{31}^1$=total ECC, high temperature, high P/E, scrambled data,

FIG. 5 is a flowchart illustrating the process 230 shown in FIG. 2 to calculate device quality figure according to one embodiment.

Upon START, the process 230 determines a dissimilarity measure of the ECC results between the unscramble and scramble modes (Block 510). There is a number of ways to express the dissimilarity measure. One simple way is to take the differences of the parameters between the unscramble and scramble modes, i.e., subtracting the corresponding parameters. Another way is to take the ratios of the parameters between the unscramble and scramble modes. Let Δ denote the dissimilarity measure. For the above illustrative list of parameters, the dissimilarity measure may be expressed as $\Delta x_{ij}$'s, $\Delta y_{ij}$'s, $\Delta z_{ij}$'s, and $\Delta w_{ij}$'s. For example, $\Delta_{23}$ is the dissimilarity measure between the unscramble and scramble modes of the maximum ECC at average temperature and high P/E, Next, the process 230 applies a function on the dissimilarity measure of the ECC results to generate the device quality figure (Block 520) and is then terminated. The function may be any suitable function. It may be a linear or non-linear function. One simple example is a linear combination of the above parameters. Let DQF represent the device quality figure and F be the function. Thus, DQF=F{$\Delta x_{ij}$, $\Delta y_{ij}$, $\Delta z_{ij}$, and $\Delta w_{ij}$}. In addition, DQF may be a scalar or a vector of any combination of the parameters. For example, DQF may be expressed as a scalar which is a linear combination of all of the parameters as follows:

$$DQF=\alpha_1 \Delta x_{ij}+\alpha_2 \Delta y_{ij}+\alpha_3 \Delta z_{ij}+\alpha_4 \Delta w_{ij} \quad (1)$$

where $\alpha_1$, $\alpha_2$, $\alpha_3$ and $\alpha_4$ are real numbers including zero.

As another example, DQF may be a vector of two components: DQF={DQF1, DQF2} where DQF1=$\alpha_1 \Delta x_{ij}+\alpha_2 \Delta y_{ij}$ and DQF2=$\alpha_3 \Delta z_{ij}+\alpha_4 \Delta w_{ij}$.

Figure 6:
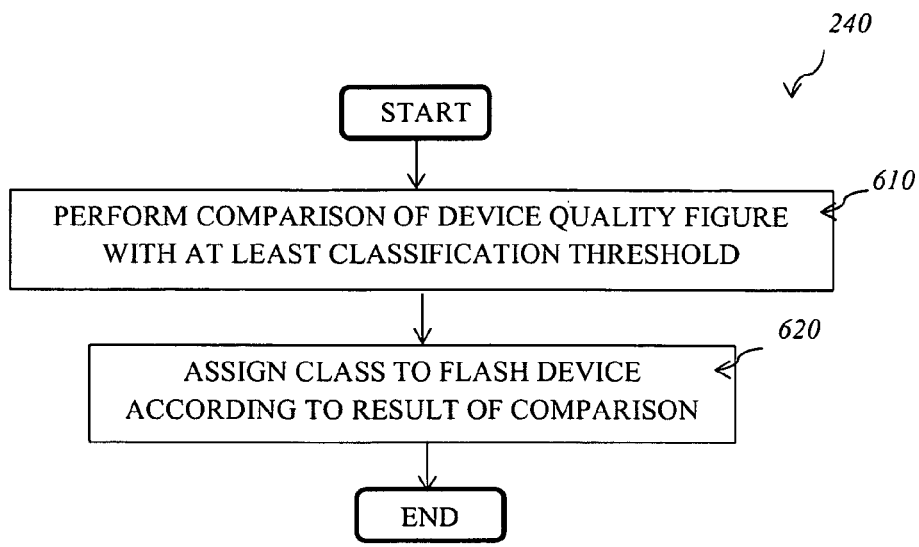
FIG. 6 is a flowchart illustrating a process to classify a flash device using classification threshold according to one embodiment.

FIG. 6 is a flowchart illustrating the process 240 shown in FIG. 2 to classify a flash device using classification threshold according to one embodiment.

Upon START, the process 240 performs a comparison of the device quality figure with at least a classification threshold (Block 610). The number of thresholds depends on the number of classes or grades that the flash devices may be classified into. For example, if it is desired to have two classes, then a single threshold may be used.

Next, the process 240 assigns a class to the flash device according to result of the comparison (Block 620) and is then terminated.

Suppose it is desired to have two classes and the threshold is $t_1$. As an illustrative example, suppose the device quality figure is a scalar computed according to the equation (1) above. Then, the classification rule is:

If DFQ<$t_1$, then classify the flash device as class 1.
else classify the flash device as class 2.

As another example, suppose three classes are desired. Then, two thresholds may be used. Denote these two thresholds as $t_1$ and $t_2$. Suppose the DFQ is a scalar. Then, the classification rule may be:

If DFQ<$t_1$, then classify the flash device as class 1.
else if $t_1 \leq$DFQ<$t_2$, then classify the flash device as class 2.
else classify the flash device as class 3.

Figure 7:
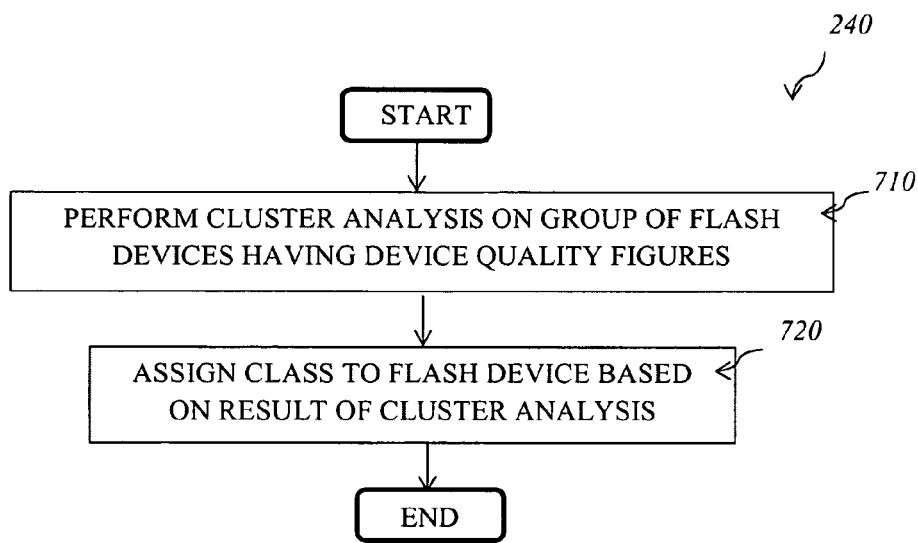
FIG. 7 is a flowchart illustrating a process to classify a flash device using cluster analysis according to one embodiment.

FIG. 7 is a flowchart illustrating the process 240 shown in FIG. 2 to classify a flash device using cluster analysis according to one embodiment. For cluster analysis, all the test parameters of the flash devices to be classified are determined. From these parameters, the flash devices are clustered into classes.

Upon START, the process 240 performs a cluster analysis on a group of flash devices having device quality figures (Block 710). The cluster analysis is discussed in the following. Next, the process 240 assigns a class to the flash device based on result of the cluster analysis (Block 720) and is then terminated.

Figure 8:
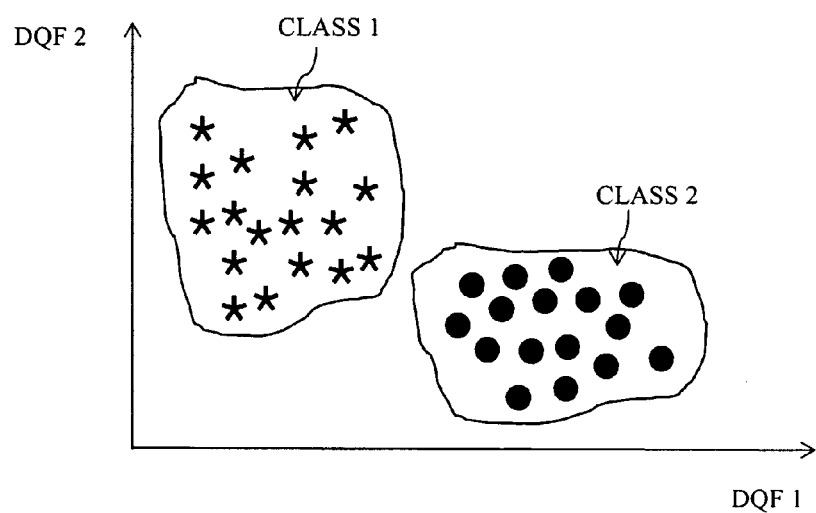
FIG. 8 is a diagram illustrating a cluster analysis to classify flash devices according to one embodiment.

FIG. 8 is a diagram illustrating a cluster analysis to classify flash devices according to one embodiment.

Cluster analysis is a technique to cluster data into clusters or groups. The objective of cluster analysis is to divide data into groups that are meaningful and/or useful. Cluster analysis may be used for classification or recognition of data or patterns. It may be referred to as unsupervised classification because there are no training or known data samples. A number of algorithms for cluster analysis exist. The clustering algorithms may be connectivity-based, density-based, centroid-based, or distribution-based. Some examples are K-means, agglomerative hierarchical clustering, and divisive hierarchical clustering.

In this illustrative example, suppose the device quality figure (DQF) is a vector having two components: DQF1 and DQF2. These are referred to as feature vectors of the device quality figure. Each of the flash devices may be represented by its feature vector which contains the values of its DQF1 and DQF2. The DQFs of the flash devices are shown in a two-dimensional space having DQF1 and DQF2 as two dimensions. Based on the cluster analysis, the flash devices are clustered into two clusters: Class 1 and Class 2.

Elements of one embodiment may be implemented by hardware, firmware, software or any combination thereof. The term hardware generally refers to an element having a physical structure such as electronic, electromagnetic, optical, electro-optical, mechanical, electro-mechanical parts, etc. A hardware implementation may include analog or digital circuits, devices, processors, applications specific integrated circuits (ASICs), programmable logic devices (PLDs), field programmable gate arrays (FPGAs), or any electronic devices. The term software generally refers to a logical structure, a method, a procedure, a program, a routine, a process, an algorithm, a formula, a function, an expression, etc. The term firmware generally refers to a logical structure, a method, a procedure, a program, a routine, a process, an algorithm, a formula, a function, an expression, etc., that is implemented or embodied in a hardware structure (e.g., flash memory, ROM, EPROM). Examples of firmware may include microcode, writable control store, micro-programmed structure. When implemented in software or firmware, the elements of an embodiment may be the code segments to perform the necessary tasks. The software/firmware may include the actual code to carry out the operations described in one embodiment, or code that emulates or simulates the operations. The program or code segments may be stored in a processor or machine accessible medium. The "processor readable or accessible medium" or "machine readable or accessible medium" may include any non-transitory medium that may store information. Examples of the processor readable or machine accessible medium that may store include a storage medium, an electronic circuit, a semiconductor memory device, a read only memory (ROM), a flash memory, an erasable programmable ROM (EPROM), a floppy diskette (FD), a compact disk (CD) ROM, Blu-ray disk (BD), a hard disk (HD), etc. The machine accessible medium may be embodied in an article of manufacture. The machine accessible medium may include information or data that, when accessed by a machine, cause the machine to perform the operations or actions described above. The machine accessible medium may also include program code, instruction or instructions embedded therein. The program code may include machine readable code, instruction or instructions to perform the operations or actions described above. The term "information" or "data" here refers to any type of information that is encoded for machine-readable purposes. Therefore, it may include program, code, data, file, etc.

All or part of an embodiment may be implemented by various means depending on applications according to particular features, functions. These means may include hardware, software, or firmware, or any combination thereof. A hardware, software, or firmware element may have several modules coupled to one another. A hardware module is coupled to another module by mechanical, electrical, optical, electromagnetic or any physical connections. A software module is coupled to another module by a function, procedure, method, subprogram, or subroutine call, a jump, a link, a parameter, variable, and argument passing, a function return, etc. A software module is coupled to another module to receive variables, parameters, arguments, pointers, etc. and/or to generate or pass results, updated variables, pointers, etc. A firmware module is coupled to another module by any combination of hardware and software coupling methods above. A hardware, software, or firmware module may be coupled to any one of another hardware, software, or firmware module. A module may also be a software driver or interface to interact with the operating system running on the platform. A module may also be a hardware driver to configure, set up, initialize, send and receive data to and from a hardware device. An apparatus may include any combination of hardware, software, and firmware modules.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. A method comprising:
   accessing test data to a flash device in unscramble and scramble modes under a test condition;
   recording error correcting code (ECC) results on the test data for the unscramble and scramble modes;
   calculating a quality figure based on the ECC results for the unscramble and scramble modes; and
   classifying the flash device using the quality figure.

2. The method of claim 1 wherein accessing the test data to the flash device comprises:
   enabling scrambling on a flash controller for the scramble mode, the flash controller having interface to the flash device;
   disabling scrambling on the flash controller for the unscramble mode; and
   accessing the test data to the flash device via the flash controller.

3. The method of claim 2 wherein the test condition includes at least one of a temperature condition and a program/erase (P/E) cycle condition.

4. The method of claim 3 wherein the temperature condition is one of a low temperature, an average temperature, and a high temperature.

5. The method of claim 3 wherein the P/E cycle condition is one of a low P/E cycle, an average P/E cycle, and a high P/E cycle.

6. The method of claim 1 wherein accessing the test data to the flash device comprises:
   writing the test data to the flash device via a flash controller; and
   reading the test data from the flash device via a flash controller.

7. The method of claim 1 wherein recording the ECC results comprises:
   recording at least one of a maximum number of ECCs, a minimum number of ECCs, an average number of ECCs, and a total number of ECCs and the corresponding test condition.

8. The method of claim 1 wherein calculating a quality figure comprises:
   determining a dissimilarity measure of the ECC results between the unscramble and scramble modes; and
   applying a function on the dissimilarity measure of the ECC results to generate the device quality figure.

9. The method of claim 1 wherein classifying the flash device comprises:
   performing a comparison of the quality figure with at least a classification threshold; and
   assigning a class to the flash device according to result of the comparison.

10. The method of claim 1 wherein classifying the flash device comprises:
    performing a cluster analysis on a group of flash devices having quality figures; and
    assigning a class to the flash device based on result of the cluster analysis.

11. An apparatus comprising:
a processor; and
a memory coupled to the processor, the memory having instructions that, when executed, cause the processor to perform operations comprising:
accessing test data to a flash device in unscramble and scramble modes under a test condition,
recording error correcting code (ECC) results on the test data for the unscramble and scramble modes,
calculating a quality figure based on the ECC results for the unscramble and scramble modes, and
classifying the flash device using the quality figure.

12. The apparatus of claim 11 wherein the instructions causing the processor to perform accessing the test data to the flash device comprise instructions that cause the processor to perform operations comprising:
enabling scrambling on a flash controller for the scramble mode, the flash controller having interface to the flash device;
disabling scrambling on the flash controller for the unscramble mode; and
accessing the test data to the flash device via a flash controller.

13. The apparatus of claim 12 wherein the test condition includes at least one of a temperature condition and a program/erase (P/E) cycle condition.

14. The apparatus of claim 13 wherein the temperature condition is one of a low temperature, an average temperature, and a high temperature.

15. The apparatus of claim 13 wherein the P/E cycle condition is one of a low P/E cycle, an average P/E cycle, and a high P/E cycle.

16. The apparatus of claim 11 wherein the instructions causing the processor to perform accessing the test data to the flash device comprise instructions that cause the processor to perform operations comprising:
writing the test data to the flash device via a flash controller; and
reading the test data from the flash device via a flash controller.

17. The apparatus of claim 11 wherein the instructions causing the processor to perform recording the ECC results comprise instructions that cause the processor to perform operations comprising:
recording at least one of a maximum number of ECCs, a minimum number of ECCs, an average number of ECCs, and a total number of ECCs and the corresponding test condition.

18. The apparatus of claim 11 wherein the instructions causing the processor to perform calculating a quality figure comprise instructions that cause the processor to perform operations comprising:
determining a dissimilarity measure of the ECC results between the unscramble and scramble modes; and
applying a function on the dissimilarity measure of the ECC results to generate the quality figure.

19. The apparatus of claim 11 wherein the instructions causing the processor to perform classifying the flash device comprise instructions that cause the processor to perform operations comprising:
performing a comparison of the quality figure with at least a classification threshold; and
assigning a class to the flash device according to result of the comparison.

20. The apparatus of claim 11 wherein the instructions causing the processor to perform classifying the flash device comprise instructions that cause the processor to perform operations comprising:
performing a cluster analysis on a group of flash devices having quality figures; and
assigning a class to the flash device based on result of the cluster analysis.

* * * * *